(12) United States Patent
Tong

(10) Patent No.: US 9,171,921 B2
(45) Date of Patent: Oct. 27, 2015

(54) TRENCH MOSFET AND METHOD FOR FABRICATING THE SAME

(71) Applicant: Silergy Semiconductor Technology (Hangzhou) Ltd., Hangzhou (CN)

(72) Inventor: Liang Tong, Hangzhou (CN)

(73) Assignee: Silergy Semiconductor Technology (Hangzhou) Ltd., Hangzhou (CN)

( * ) Notice: Subject to any disclaimer, the term of this patent is extended or adjusted under 35 U.S.C. 154(b) by 0 days.

(21) Appl. No.: 14/469,748

(22) Filed: Aug. 27, 2014

(65) Prior Publication Data

US 2015/0061002 A1    Mar. 5, 2015

(30) Foreign Application Priority Data

Aug. 27, 2013   (CN) .......................... 2013 1 0378544

(51) Int. Cl.
*H01L 29/423*     (2006.01)
*H01L 29/66*      (2006.01)
*H01L 29/78*      (2006.01)
*H01L 29/45*      (2006.01)
*H01L 29/49*      (2006.01)
*H01L 29/06*      (2006.01)

(52) U.S. Cl.
CPC ...... *H01L 29/42364* (2013.01); *H01L 29/0615* (2013.01); *H01L 29/42376* (2013.01); *H01L 29/458* (2013.01); *H01L 29/4916* (2013.01); *H01L 29/66484* (2013.01); *H01L 29/66515* (2013.01); *H01L 29/66734* (2013.01); *H01L 29/7813* (2013.01); *H01L 29/7831* (2013.01)

(58) Field of Classification Search
CPC ..................... H01L 29/4236; H01L 29/42352; H01L 29/42356; H01L 29/7813
See application file for complete search history.

(56) References Cited

U.S. PATENT DOCUMENTS

2010/0123192 A1*  5/2010  Burke et al. .................. 257/334
2012/0326229 A1   12/2012  Poelzl et al.

FOREIGN PATENT DOCUMENTS

CN        103199053 A      7/2013
CN        103413765 A     11/2013

OTHER PUBLICATIONS

Chinese Office Action for Chinese Patent Application No. 201310378544.7, dated Jun. 5, 2015, 6 pages.

* cited by examiner

*Primary Examiner* — Jae Lee
(74) *Attorney, Agent, or Firm* — Westman, Champlin & Koehler, P.A.

(57) ABSTRACT

The present disclosure relates to a trench MOSFET and a method for fabricating the same. The method comprises: providing a substrate with an epitaxy layer; forming a trench in the epitaxy layer; forming a first insulating layer, a first gate, a second insulating layer, and a second gate successively in the trench by deposition and etching; forming a well and a source region at both sides of the trench by ion implantation, and forming a trench-type contact and a metal plug. By forming the first gate and the second gate which are separated from each other, the first insulating layer between a lower portion of the first gate and the epitaxy layer has a thickness larger than that of the second insulating layer between the second gate and the well and the source region. The two separate gates are connected with each other by the metal plug. The resultant MOSFET has an increased breakdown voltage and stable performance while its manufacturer cost is lowered because the manufacturer process is simplified.

17 Claims, 6 Drawing Sheets

TRENCH MOSFET AND METHOD FOR FABRICATING THE SAME

RELATED APPLICATIONS

This application claims the benefit of Chinese Patent Application No. 201310378544.7, filed on Aug. 27, 2013, which is incorporated herein by reference in its entirety.

TECHNICAL FIELD

The present disclosure generally relates to the field of semiconductor manufacture processes, and more specifically, to a trench MOSFET and a method for fabricating the same.

BACKGROUND

The performance of a metal-oxide-semiconductor field effect transistor (MOSFET) is evaluated in terms of its response speed, on-off current ratio, threshold voltage, and the like. To increase the response speed and the on-off current ratio and decrease the threshold voltage of the MOSFET, the MOSFET should have a gate oxide layer with a decreased thickness. However, the thinner the gate oxide layer is, the more easily the gate oxide layer is broken down by charge accumulated at a gate electrode when a gate voltage is relatively high, resulting in failure of the MOSFET.

To increase a breakdown voltage of the MOSFET while maintaining a relatively high response speed, a relatively large on-off current ratio and a relatively low threshold voltage, the charge accumulating at the gate should be eliminated to avoid breakdown of the gate oxide layer.

A conventional MOSFET typically exhibits a large gate-drain capacitance Cgd because a gate oxide layer below a gate has a small thickness. Consequently, a large amount of electric charge may be easily accumulated on the gate electrode of the device to break down the gate oxide layer, and hence the performance of withstanding high voltage of the MOSFET is poor. As an improved prior art, there is provided a MOSFET structure as shown in FIG. 1, in which the MOSFET is formed in an N− epitaxy layer 1 on N+ substrate 2. The bottom of the N+ substrate 2 is covered with a metal stack of Ti/Ni/Ag as a drain metal 8. A trench 3 extends into the N− epitaxy layer 1 from an upper surface of the N− epitaxy layer 1. A lower portion of the inner surface of the trench 3 is covered with a first insulating layer 4, and an upper portion of the inner surface of the trench 3 is covered with a second insulating layer 5, as a gate oxide layer. The first insulating layer 4 has a thickness larger than that of the second insulating layer 5. A polysilicon protection electrode 6 is formed at an upper portion of the inner surface of the trench 3, with a side wall surrounded by the second insulating layer 5 and a bottom contacting the first insulating layer 4. A gate 7 is formed in the trench 3 and surrounded by the polysilicon protection electrode 6. A lower portion of the gate 7 is located below the polysilicon protection electrode 6 and surrounded by the first insulating layer 4. An upper portion of the gate 7 is adjacent to the polysilicon protection electrode 6 and surrounded by the second insulating layer 5. That is, the protection polysilicon electrode 6 is located between the gate 7 and an upper portion of the inner surface of the trench 3. In this structure, the polysilicon protection electrode 6 is added between the gate 7 and the N− epitaxy layer 1 which is used as a drain. The protection electrode is connected to a source, and thus is an actual source of the device.

This structure is proposed for converting a gate-drain capacitance Cgd into a gate-source capacitance Cgs and a drain-source capacitance Cds, so that an effect of the gate-drain capacitance Cgd on the device is reduced and a breakdown voltage of the device is improved. However, the gate 7 and the polysilicon protection electrode 6 should be well insulated in this structure, which means many difficulties in the process. Consequently, the device has variable breakdown voltage and poor reliability, and the manufacture process for the structure includes complex steps, resulting in increased manufacture cost.

SUMMARY

One object of the present disclosure is to provide a trench MOSFET and a method for fabricating the same. The resultant MOSFET has an increased breakdown voltage while maintaining a low threshold voltage, a large on-off current ratio and a high response speed. The method is simplified for providing a reproducible MOSFET with a stable performance, and leads to reduced manufacture cost.

According to one aspect of the present disclosure, there is provided a method for fabricating a trench MOSFET, comprising:

providing a substrate having a body of a first conductivity type and an epitaxy layer of the first conductivity type on the body;

forming a trench by etching the epitaxy layer;

depositing a first insulating layer and a first polysilicon layer successively on the epitaxy layer, the first polysilicon layer filling the trench;

forming a first gate in the trench by etching the first polysilicon layer;

etching off an exposed portion of the first insulating layer, and depositing a second insulating layer and a second polysilicon layer successively, the second polysilicon layer filling the trench;

forming a second gate in the trench by etching the second polysilicon layer;

forming a well of a second conductivity type by performing a first ion implanting after etching off an exposed portion of the second insulting layer to expose the epitaxy layer;

forming a source region of the first conductivity type by performing a second ion implanting at the surface of the well;

depositing a third insulating layer on the source region and over the trench;

forming a gate opening and a source opening by etching, the gate opening extending through the third insulating layer, the second gate, the second insulating layer and into the first gate, and the source opening extending through the third insulating layer, the source region and into the well; and forming metal plugs by filling a metal layer in the gate opening and in the source opening.

Preferably, the method further comprises forming a gate metal and a source metal by extending the metal plugs above the third insulating layer when the metal plugs are formed.

Preferably, the method further comprises depositing a drain metal on a back surface of the body after forming the gate metal and the source metal.

Preferably, the third insulating layer is an oxide layer.

Preferably, the metal plugs, the gate metal, the source metal and the drain metal are each made of aluminum alloy or copper, and are lined with a barrier metal stack of Ti/TiN, Co/TiN or Ta/TiN.

Preferably, the epitaxy layer has a doping concentration smaller than that of the body.

Preferably, the method further comprises depositing a hard mask layer on the epitaxy layer before forming the trench; and forming an etching opening by etching the hard mask layer.

Preferably, the hard mask layer is an oxide layer having a thickness of about 0.1 micrometer to about 1 micrometer.

Preferably, the etching opening has a width of about 0.5 micrometer to about 5 micrometers.

Preferably, the trench has a depth of about 0.5 micrometer to about 50 micrometers.

Preferably, the first insulating layer is an oxide layer having a thickness of about 0.1 micrometer to about 2 micrometers.

Preferably, a sum of a thickness of the first polysilicon layer and a thickness of the first insulating layer is larger than one half of a width of the trench.

Preferably, an upper surface of the first gate is about 0.1 micrometer to about 1 micrometer below an upper surface of the epitaxy layer.

Preferably, the second insulating layer has a thickness smaller than that of the first insulating layer.

Preferably, the second insulating layer is an oxide layer.

Preferably, an upper surface of the second gate is about 0 micrometer to about 0.1 micrometer below an upper surface of the epitaxy layer.

Accordingly, there is provided a trench MOSFET fabricated by the above method, comprising:

a substrate having a body of a first conductivity type and an epitaxy layer of the first conductivity type on the body;

a trench extending into the epitaxy layer from an upper surface of the epitaxy layer;

a first insulating layer at a lower portion of an inner surface of the trench;

a first gate in the trench and having a lower portion surrounded by the first insulating layer;

a second insulating layer at an upper portion of the inner surface of the trench and covering the first gate, the first insulating layer and the second insulating layer together surrounding the first gate;

a second gate at an upper portion of the trench and surrounded by the second insulating layer, the second gate having an upper surface below an upper surface of the epitaxy layer;

a well of the second conductivity type at a surface portion of the epitaxy layer at both sides of the trench;

a source region of the first conductivity type at a surface portion of the well at both sides of the trench;

a third insulating layer at the top surface of the source region and over the trench;

a gate opening extending through the third insulating layer, the second gate, the second insulating layer and into the first gate;

a source opening extending through the third insulating layer, the source region and into the first gate; and metal plugs in the gate opening and in the source opening.

The present disclosure can advantageously provide the following beneficial effects over the prior art:

1. in the trench MOSFET and the method for fabricating the same, the first gate and the second gate are formed as being separated from each other so that the first insulating layer between a lower portion of the first gate and the epitaxy layer has a large thickness, and the second insulating layer between the second gate and the well and the source region has a small thickness; two separate gates are connected with each other by metal plugs; thus, the MOSFET has a small gate-drain capacitance and avoids failure due to the breakdown of the gate oxide layer by the charge accumulated on the gate when a large voltage is applied to the MOSFET; consequently, the MOSFET has a high breakdown voltage while maintaining a low threshold voltage, a large on-off current ratio and a high response speed;

2. it is not critical whether the first gate and the second gate are well insulated or not; the process can be repeated and the resultant MOSFET has a stable breakdown voltage; the method is simplified with less steps, and will not increase manufacture cost while the breakdown voltage of the MOSFET is improved.

DESCRIPTION OF EMBODIMENTS

Reference will now be made in detail to particular embodiments of the disclosure, examples of which are illustrated in the accompanying drawings. While the disclosure will be described in conjunction with the preferred embodiments, it will be understood that they are not intended to limit the disclosure to these embodiments. On the contrary, the disclosure is intended to cover alternatives, modifications and equivalents that may be included within the spirit and scope of the disclosure as defined by the appended claims.

Furthermore, in the following detailed description of the preferred embodiments according to the present disclosure, numerous specific details are shown in conjunction with attached drawings. For simplicity and clarity of illustration, elements illustrated in the attached drawings are not necessarily drawn to scale. It will be understood that the dimensions of the elements are not intended to limit the disclosure.

Figure 1:
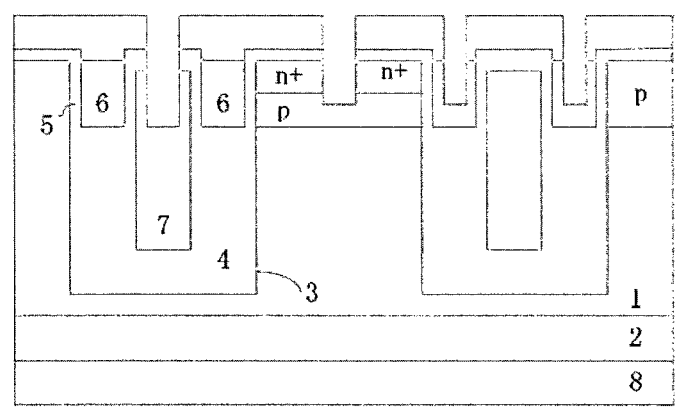
FIG. 1 illustrates a schematic diagram of an example structure of a MOSFET according to the prior art.
Figure 2:
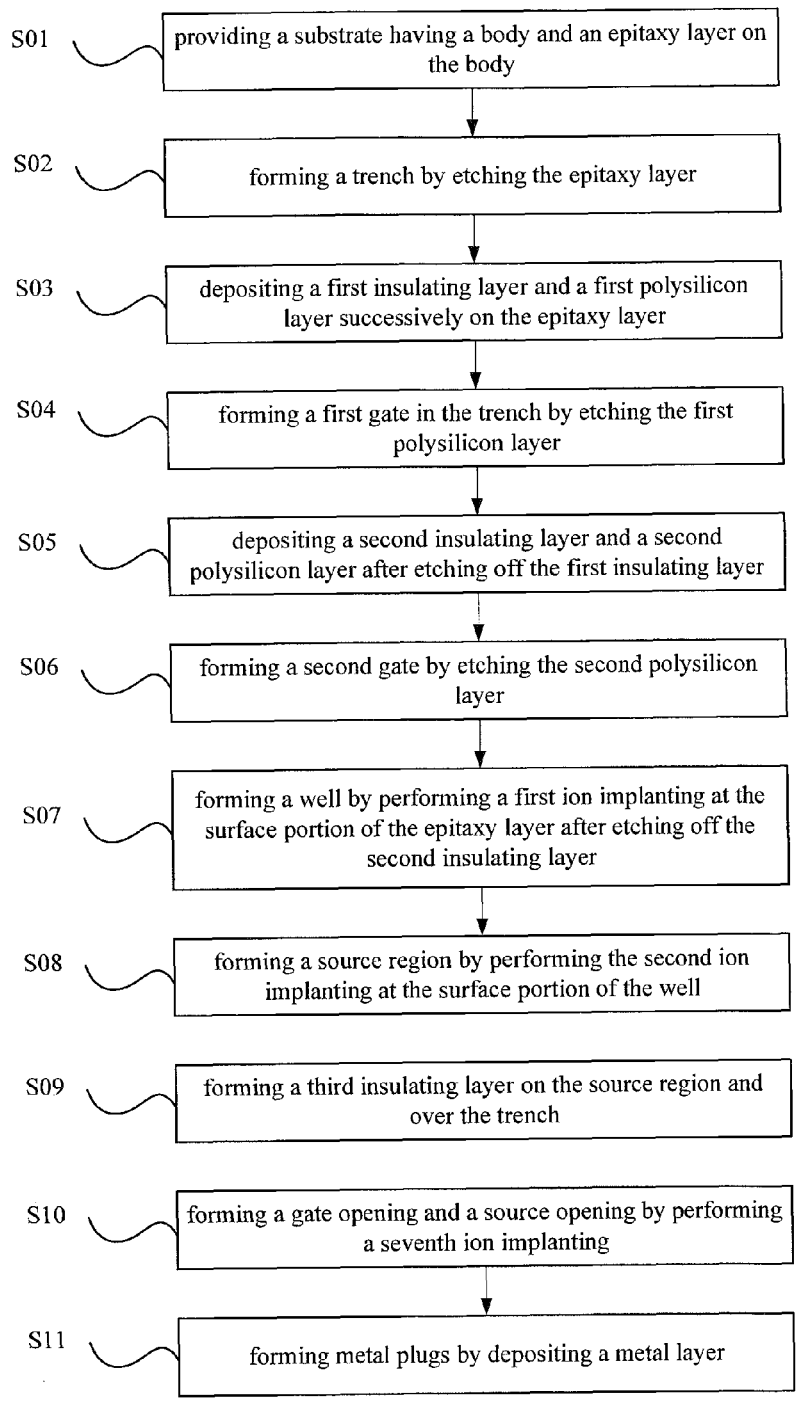
FIG. 2 illustrates a flow chart of a method for fabricating a trench MOSFET according to an embodiment of the present disclosure.

FIG. 2 illustrates a flow chart of a method for fabricating a trench MOSFET according to an embodiment of the present disclosure. As shown in FIG. 2, the present disclosure relates to a method for fabricating a trench MOSFET, comprising the following steps:

step S01: providing a substrate having a body of a first conductivity type and an epitaxy layer of the first conductivity type on the body;

step S02: forming a trench by etching the epitaxy layer;

step S03: depositing a first insulating layer and a first polysilicon layer successively on the epitaxy layer, the first polysilicon layer completely filling the trench;

step S04: forming a first gate in the trench by etching the first polysilicon layer;

step S05: etching off an exposed portion of the first insulating layer, and depositing a second insulating layer and a second polysilicon layer successively, the second polysilicon layer completely filling the trench;

step S06: forming a second gate in the trench by etching the second polysilicon layer;

step S07: forming a well of a second conductivity type by performing a first ion implanting after etching off an exposed portion of the second insulting layer to expose the epitaxy layer;

step S08: forming a source region of the first conductivity type by performing a second ion implanting at the surface of the well;

step S09: depositing a third insulating layer on the source region and over the trench;

step S10: forming a gate opening and a source opening by etching, the gate opening extending through the third insulating layer, the second gate, the second insulating layer and into the first gate, and the source opening extending through the third insulating layer, the source region and into the well; and step S11: forming metal plugs by filling a metal layer in the gate opening and in the source opening.

FIGS. 3 to 14 illustrate schematic diagrams of example structures in various stages of a method for fabricating a trench MOSFET according to an embodiment of the present disclosure. Referring to FIG. 2 and in connection with FIGS. 3 to 14, the method for fabricating the trench MOSFET according to the present disclosure will be depicted in details.

Figure 3:
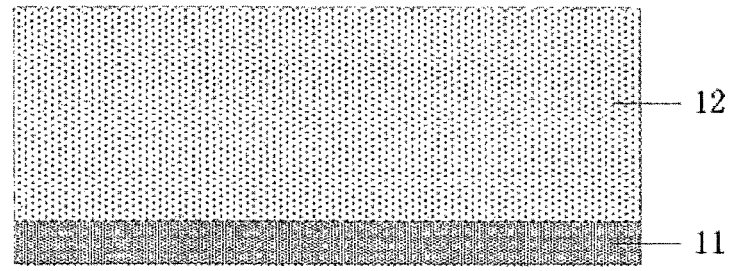
FIGS. 3 to 14 illustrate schematic diagrams of example structures in various stages of a method for fabricating a trench MOSFET according to an embodiment of the present disclosure.

In step S01, there is provided a substrate having a body 11 of a first conductivity type and an epitaxy layer 12 of the first conductivity type on the body, as shown in FIG. 3.

In the present embodiment, the first conductivity type is of N type. The body 11 is a heavily-doped N-type substrate, and the epitaxy layer 12 is a lightly-doped N-type epitaxy layer. That is, the epitaxy layer 12 has a doping concentration smaller than that of the body 11.

Figure 4:
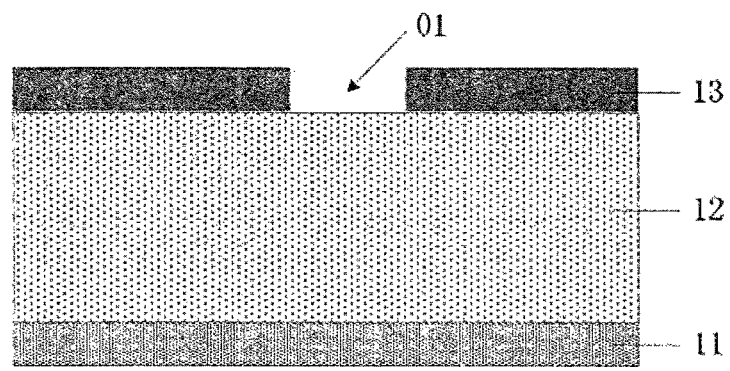

This step further includes depositing a hard mask layer 13 on the epitaxy layer 11 and forming an etching opening 01 by etching the hard mask layer 13, as shown in FIG. 4.

The hard mask layer 13 is an oxide layer formed by thermal oxidation, atmospheric pressure chemical vapor deposition, or low pressure chemical vapor deposition. The hard mask layer 13 has a thickness of about 0.1 micrometer to about 1 micrometer.

A photoresist layer is applied over the hard mask layer 13, and then is subjected to lithography to expose a portion of the hard mask layer. The exposed portion of the hard mask layer 13 is etched off and then the photoresist layer is also removed, so that an etching opening 01 is formed in the hard mask layer 13. The etching opening 01 has a width of about 0.5 micrometer to about 5 micrometers. The etching opening 01 exposes a portion of the epitaxy layer 12.

Figure 5:
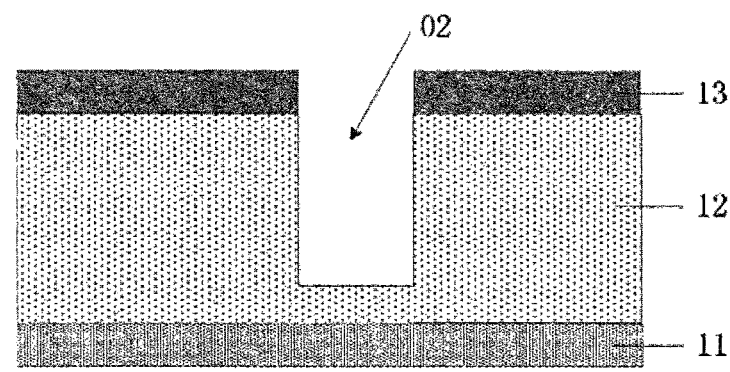

In step S02, a trench 02 is formed by etching the epitaxy layer 12, as shown in FIG. 5.

The epitaxy layer 12 is etched through the etching opening 01 in the hard mask layer 13, so as to form a trench 02. Then, the hard mask layer 13 is removed. The trench 02 extends into the epitaxy layer 12 from an upper surface of the epitaxy layer 12. The trench 02 has a bottom above a boundary between the body 11 and the epitaxy layer 12. Preferably, the trench 02 has a depth in the range of about 0.5 micrometer to about 50 micrometers.

Figure 6:
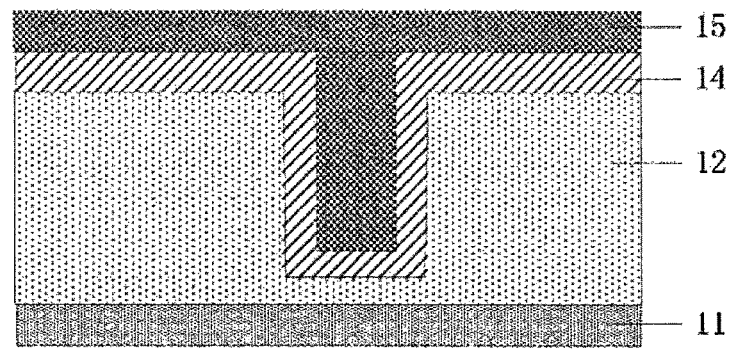

In step S03, a first insulating layer 14 and a first polysilicon layer 15 are deposited successively on the epitaxy layer 12. The first polysilicon layer 15 completely fills the trench, as shown in FIG. 6.

The first insulating layer 14 is a dielectric layer having a large thickness. In this embodiment, the first insulating layer 14 is an oxide layer (for example, silicon dioxide) having a thickness of about 0.1 micrometer to about 2 micrometers.

A sum of a thickness of the first polysilicon layer 15 and a thickness of the first insulating layer 14 is larger than one half of a width of the trench 02, so that the first polysilicon layer 15 completely fills the whole trench.

Figure 7:
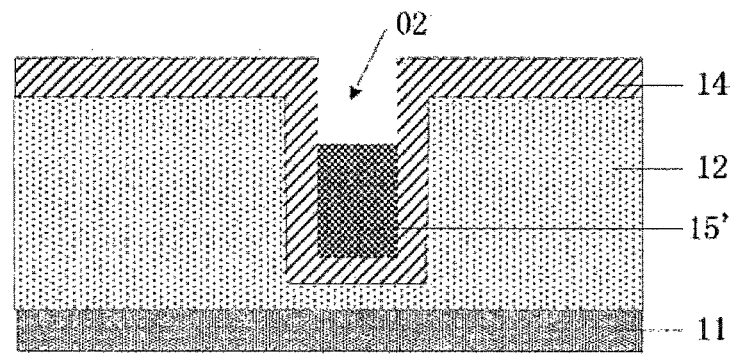

In step S04, the portion of the first polysilicon layer 15 outside the trench 02 is firstly etched off, and a portion of the first polysilicon layer 15 inside the trench is then etched back, so as to form a first gate 15' in the trench 02, as shown in FIG. 7.

The first gate 15' is formed by completely removing the portion of the portion of the first polysilicon layer 15 on the epitaxy layer 12 and by etching a portion of the polysilicon layer 15 in the trench 02. The first insulating layer 14 functions as a gate oxide layer. The first gate 15' has an upper surface which is about 0.1 micrometer to about 1 micrometer below an upper surface of the epitaxy layer 12.

Figure 8:
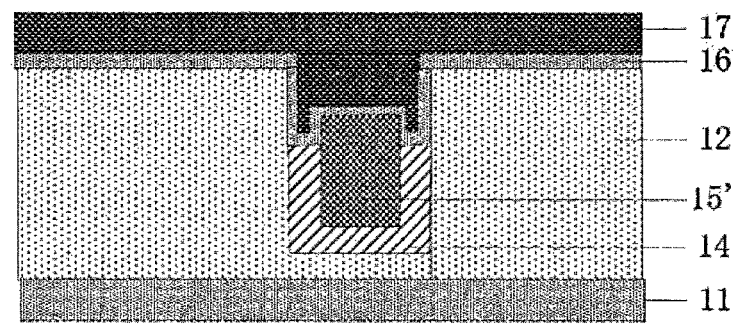

In step S05, an exposed portion of the first insulating layer 14 is etched off, and a second insulating layer 16 and a second polysilicon layer 17 are deposited successively. The second polysilicon layer 17 completely fills the trench, as shown in FIG. 8.

The portion of the first insulating layer 14 on the epitaxy layer 12 is firstly completely removed, and then an exposed portion of the first insulating layer 14 on a side wall of the trench 02 is etched off. A second insulating layer 16 is deposited on an upper portion of the side wall of the trench 02, on an upper portion of the side wall of the first gate 15', and on an upper surface of the first gate 15. The second insulating layer 16 contacts the first insulating layer 14.

The second insulating layer 16 is a gate oxide layer and has a thickness smaller than that of the first insulating layer 14.

Next, a second polysilicon layer 17 is deposited to completely fill the trench.

Figure 9:
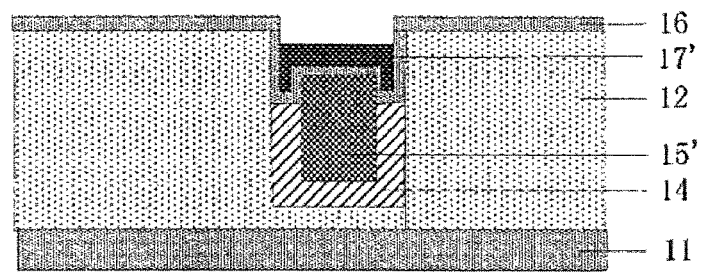

In step S06, the portion of the second polysilicon layer 17 outside the trench 02 is firstly etched off, and a portion of the second polysilicon layer 17 inside the trench is then etched back, so as to form a second gate 17' in the trench 02, as shown in FIG. 9.

The portion of the second polysilicon layer 17 on the second insulating layer 16 is completely etched off. To ensure that the portion of the second polysilicon layer 17 outside the trench is completely removed, the second gate 17 has an upper surface which is at least 0.1 micrometer below the upper surface of the epitaxy layer 12. Consequently, the portion of the second polysilicon outside the trench are completely removed.

Figure 10:
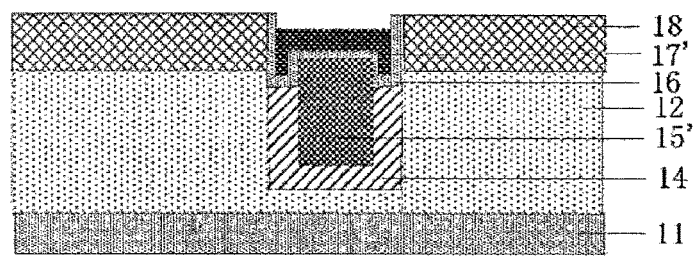

In step S07, an exposed portion of the second insulating layer 16 is etched off to expose an upper surface of the epitaxy layer 12. A well 18 of a second conductivity type is formed at a surface portion of the epitaxy layer 12 on both sides of the trench by performing a first ion implanting, as shown in FIG. 10.

After the first ion implanting, the method further includes performing thermal diffusion for the well 18 at the surface portion of the epitaxy layer 12. The first ion implanting is performed by using a P-type dopant to form a P-type well.

Figure 11:
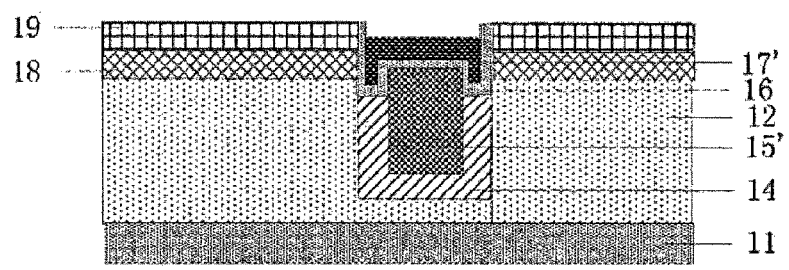

In step S08, a source region 19 of the first conductivity type is formed by performing a second ion implanting at the surface portion of the well 18, as shown in FIG. 11.

In this embodiment, the first conductivity is of an N type. A photoresist is applied over a surface of the well 18 and a surface of the second gate 17'. The photoresist is subjected to lithography to expose the well 18. The second ion implanting is performed at an exposed surface portion of the well by using an N-type dopant, followed by thermal diffusion. An N-type source region 19 is thus formed at a surface portion of the well 18.

Figure 12:
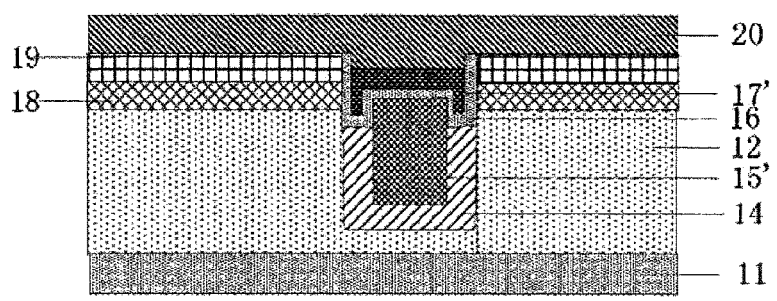

In step S09, a third insulating layer 20 is deposited on the source region 19 and over the trench, as shown in FIG. 12.

In this embodiment, the third insulating layer 20 is an oxide layer (for example, silicon dioxide), or is made of other materials well known in the field.

Figure 13:
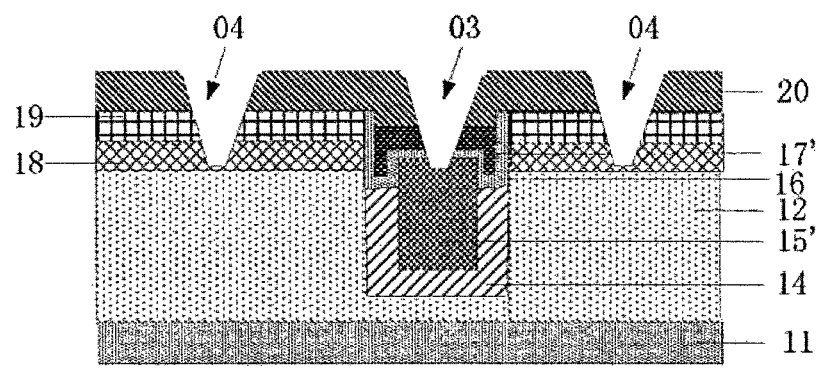

In step S10, a gate opening 03 and a source opening 04 are formed by etching. The gate opening 03 extends through the third insulating layer 20, the second gate 17', the second insulating layer 16 and into the first gate 15', and the source opening 04 extends through the third insulating layer 20, the source region 19 and into the well 18, as shown in FIG. 13.

A photoresist layer is applied over the third insulating layer 20. The photoresist layer is subjected to exposure and development to expose portions of the third insulating layer 20 on the source region 19 and over the trench. The exposed portions of the third insulating layer 16, the second gate 17', the second insulating layer 16 and the first gate 15' are etched to form the gate opening 03, and the exposed portions of the third insulating layer 20, the source region 19 and the well 18 are etched to form the source opening 04.

Figure 14:
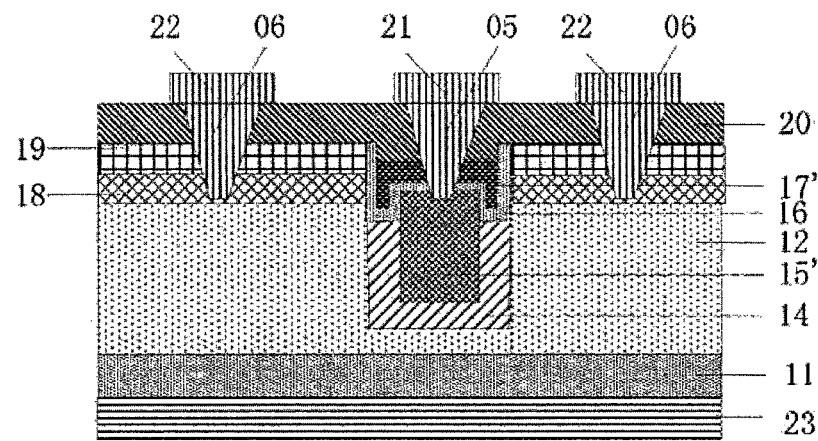

In step S11, metal plugs 05, 06 are formed by filling a metal layer in the gate opening 03 and in the source opening 04, respectively, as shown in FIG. 14.

Optionally, this step further includes extending the metal plugs 05, 06 above the third insulating layer to form a gate metal 21 and a source metal 22, and forming a drain metal 23 by depositing a metal layer at a back surface of the body 11.

The metal plugs 05, 06 are formed by depositing a metal layer in the gate opening 03 and in the source opening. In this embodiment, the metal layer thus deposited extends above the third insulating layer 20 to form a gate metal 21 and a source metal 22. In other embodiments, the gate metal 21 and the source metal 22 can also be formed above the metal plugs 05 and 06, respectively, in separate steps. The drain metal 23 is deposited on the back surface of the body 11.

The meal materials in the metal plugs 05 and 06, in the gate metal 21, in the source metal 22 and in the drain metal 23 may be each made of aluminum alloy or copper or of other metals well known by one skilled person, and may be lined with a barrier metal stack of Ti/TiN, Co/TiN or Ta/TiN.

In the present disclosure, the first gate 15' and the second gate 17' are formed as being separated from each other so that the first insulating layer 14 between a lower portion of the first gate 15' and the epitaxy layer 12 has a large thickness, and the second insulating layer 16 between the second gate 17' and the well 18 and the source region 19 has a small thickness; two separate gates are connected with each other by the metal plug 05; thus, the MOSFET has a small gate-drain capacitance and avoids failure due to the breakdown of the gate oxide layer by the charge accumulated on the gate when a large voltage is applied to the MOSFET; consequently, the MOSFET has a high breakdown voltage while maintaining a low threshold voltage, a large on-off current ratio and a high response speed;

Accordingly, there is provided a trench MOSFET fabricated by the above method, as shown in FIG. 14, comprising:
a substrate having a body 11 of a first conductivity type and an epitaxy layer 12 of the first conductivity type on the body 11;
a trench extending into the epitaxy layer 12 from an upper surface of the epitaxy layer 12;
a first insulating layer 14 at a lower portion of an inner surface of the trench;
a first gate 15' in the trench and adjacent to the first insulating layer 14, the first gate 15' having a lower portion surrounded by the first insulating layer 14;
a second insulating layer 16 at an upper portion of the inner surface of the trench and covering the first gate 15', the first insulating layer 14 and the second insulating layer 16 together surrounding the first gate;
a second gate 17' at an upper portion of the trench, between the upper portion of the inner surface of the trench and the portion of the second insulating layer at the upper portion of the outer surface of the first gate 15', the second gate 17' having an upper surface below an upper surface of the epitaxy layer 12;
a well 18 of the second conductivity type at a surface portion of the epitaxy layer 12 at both sides of the trench;
a source region 19 of the first conductivity type at a surface portion of the well 18 at both sides of the trench;
a third insulating layer 20 at the top surface of the source region 19 and over the trench, the second insulating layer 16 and the third insulating layer 20 together surrounding the second gate;
a gate opening extending through the third insulating layer 20, the second gate 17', the second insulating layer 16 and into the first gate 15';
a source opening extending through the third insulating layer 20, the source region 19 and into the first gate 18; and
metal plugs 05 and 06 in the gate opening and in the source opening.

Further, the trench MOSFET includes:
a gate metal 21 on the third insulating layer 20 and connected to the metal plug 05;
a drain metal 22 on the third insulating layer 20 and connected to the metal plug 06;
a drain metal 23 on a back surface of the body 11.

To sum up, in the trench MOSFET and the method for fabricating the same, the first gate and the second gate are formed as being separated from each other so that the first insulating layer between a lower portion of the first gate and the epitaxy layer has a large thickness, and the second insulating layer between the second gate and the well and the source region has a small thickness; two separate gates are connected with each other by metal plugs; thus, the MOSFET has a small gate-drain capacitance and avoids failure due to the breakdown of the gate oxide layer by the charge accumulated on the gate when a large voltage is applied to the MOSFET; consequently, the MOSFET has a high breakdown voltage while maintaining a low threshold voltage, a large on-off current ratio and a high response speed; it is not critical whether the first gate and the second gate are well insulated or not; the process can be repeated and the resultant MOSFET has a stable breakdown voltage; the method is simplified with less steps, and will not increase manufacture cost while the breakdown voltage of the MOSFET is improved.

The embodiments were chosen and described in order to best explain the principles of the disclosure and its practical applications, to thereby enable others skilled in the art to best utilize the disclosure. The disclosure is intended to cover alternatives, modifications and equivalents that may be included within the spirit and scope of the disclosure as defined by the appended claims.

What is claimed is:
1. A method for fabricating a trench MOSFET, comprising:
providing a substrate having a body of a first conductivity type and an epitaxy layer of said first conductivity type on said body;
forming a trench by etching said epitaxy layer;
depositing a first insulating layer and a first polysilicon layer successively on said epitaxy layer, said first polysilicon layer filling said trench;
forming a first gate in said trench by etching said first polysilicon layer;
etching off an exposed portion of said first insulating layer, and depositing a second insulating layer and a second polysilicon layer successively, said second polysilicon layer filling said trench;
forming a second gate in said trench by etching said second polysilicon layer;
forming a well of a second conductivity type by performing a first ion implanting after etching off an exposed portion of said second insulting layer to expose said epitaxy layer;

forming a source region of said first conductivity type by performing a second ion implanting at said surface of said well;

depositing a third insulating layer on said source region and over said trench;

forming a gate opening and a source opening by etching, said gate opening extending through said third insulating layer, said second gate, said second insulating layer and into said first gate, and said source opening extending through said third insulating layer, said source region and into said well; and forming metal plugs by filling a metal layer in said gate opening and in said source opening, respectively.

2. The method according to claim 1, further comprising forming a gate metal and a source metal by extending said metal plugs above said third insulating layer when said metal plugs are formed.

3. The method according to claim 2, further comprising depositing a drain metal on a back surface of said body after forming said gate metal and said source metal.

4. The method according to claim 3, wherein said third insulating layer is an oxide layer.

5. The method according to claim 4, wherein said metal plugs, said gate metal, said source metal and said drain metal are each made of aluminum alloy or copper, and are lined with a barrier metal stack of Ti/TiN, Co/TiN or Ta/TiN.

6. The method according to claim 1, wherein said epitaxy layer has a doping concentration smaller than that of said body.

7. The method according to claim 1, further comprising:
 depositing a hard mask layer on said epitaxy layer before forming said trench; and
 forming an etching opening by etching said hard mask layer.

8. The method according to claim 7, wherein said hard mask layer is an oxide layer having a thickness of about 0.1 micrometer to about 1 micrometer.

9. The method according to claim 8, wherein said etching opening has a width of about 0.5 micrometer to about 5 micrometers.

10. The method according to claim 1, wherein said trench has a depth of about 0.5 micrometer to about 50 micrometers.

11. The method according to claim 1, wherein said first insulating layer is an oxide layer having a thickness of about 0.1 micrometer to about 2 micrometers.

12. The method according to claim 11, wherein a sum of a thickness of said first polysilicon layer and a thickness of said first insulating layer is larger than one half of a width of said trench.

13. The method according to claim 12, wherein an upper surface of said first gate is about 0.1 micrometer to about 1 micrometer below an upper surface of said epitaxy layer.

14. The method according to claim 1, wherein said second insulating layer has a thickness smaller than that of said first insulating layer.

15. The method according to claim 14, wherein said second insulating layer is a gate oxide layer.

16. The method according to claim 15, wherein an upper surface of said second gate is about 0 micrometer to about 0.1 micrometer below an upper surface of said epitaxy layer.

17. A trench MOSFET fabricated by said method according to claim 1 comprising:
 a substrate having a body of a first conductivity type and an epitaxy layer of said first conductivity type on said body;
 a trench extending into said epitaxy layer from an upper surface of said epitaxy layer;
 a first insulating layer at a lower portion of an inner surface of said trench;
 a first gate in said trench and having a lower portion surrounded by said first insulating layer;
 a second insulating layer at an upper portion of said inner surface of said trench and covering said first gate, said first insulating layer and said second insulating layer together surrounding said first gate;
 a second gate at an upper portion of said trench and surrounded by said second insulating layer, said second gate having an upper surface below an upper surface of said epitaxy layer;
 a well of said second conductivity type at a surface portion of said epitaxy layer at both sides of said trench;
 a source region of said first conductivity type at a surface portion of said well at both sides of said trench;
 a third insulating layer at the top surface of said source region and over said trench;
 a gate opening extending through said third insulating layer, said second gate, said second insulating layer and into said first gate;
 a source opening extending through said third insulating layer, said source region and into said first gate; and
 metal plugs in said gate opening and in said source opening, respectively.

\* \* \* \* \*